(12) United States Patent
Yamaguchi et al.

(10) Patent No.: US 8,729,509 B2
(45) Date of Patent: May 20, 2014

(54) DRAWING APPARATUS AND METHOD OF MANUFACTURING ARTICLE

(75) Inventors: Wataru Yamaguchi, Utsunomiya (JP); Takahiro Matsumoto, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/334,247

(22) Filed: Dec. 22, 2011

(65) Prior Publication Data

US 2012/0164583 A1 Jun. 28, 2012

(30) Foreign Application Priority Data

Dec. 27, 2010 (JP) ................................. 2010-291126

(51) Int. Cl.
*G21K 5/04* (2006.01)
*H01J 37/04* (2006.01)
*H01J 37/317* (2006.01)

(52) U.S. Cl.
CPC ............. *H01J 37/04* (2013.01); *H01J 37/3174* (2013.01); *G21K 5/04* (2013.01)
USPC .................. 250/492.3; 250/492.1; 250/396 R; 250/397

(58) Field of Classification Search
CPC ... H01J 37/3174; H01J 37/3175; H01J 37/00; H01J 37/04; H01J 37/147
USPC .......... 250/396 R, 397, 492.1, 492.2, 492.21, 250/492.22, 492.3
See application file for complete search history.

(56) References Cited

U.S. PATENT DOCUMENTS

| | | | | |
|---|---|---|---|---|
| 5,939,725 A | * | 8/1999 | Muraki | ................... 250/492.22 |
| 6,436,594 B2 | | 8/2002 | Tokunaga | |
| 6,583,430 B1 | | 6/2003 | Muraki | |
| 2005/0040343 A1 | * | 2/2005 | Sohda et al. | ................ 250/492.1 |

FOREIGN PATENT DOCUMENTS

| | | |
|---|---|---|
| JP | 6326370 A | 10/1988 |
| JP | 2000-049069 A | 2/2000 |
| JP | 2001-168013 A | 6/2001 |

* cited by examiner

*Primary Examiner* — Nicole Ippolito
(74) *Attorney, Agent, or Firm* — Rossi, Kimms & McDowell, LLP (57) ABSTRACT

A drawing apparatus performs drawing on a substrate with a plurality of charged particle beams. The apparatus comprises a stage configured to hold the substrate and to be moved; a projection system configured to project the plurality of charged particle beams onto the substrate; a measurement device configured to detect a charged particle beam that reaches the measurement device due to a charged particle beam incident, via the projection system, on a mark formed on the substrate, to measure a position of the mark; and a controller. The controller is configured to control operations of the projection system and the measurement device so that the position of the mark is measured with at least one of the plurality of charged particle beams, in parallel with drawing on the substrate with a part of the plurality of charged particle beams.

11 Claims, 7 Drawing Sheets

DRAWING APPARATUS AND METHOD OF MANUFACTURING ARTICLE

BACKGROUND OF THE INVENTION

1. Field of the Invention

The present invention relates to a drawing apparatus which performs drawing on a substrate with a plurality of charged particle beams, and a method of manufacturing an article.

2. Description of the Related Art

In recent years, with an increase in packing density and miniaturization of semiconductor integrated circuits, the line width of a pattern formed on a substrate has become very small. To keep up with this trend, a finer pattern must be transferred in a lithography process in which a resist pattern is formed on a substrate. A drawing scheme that uses an electron beam is known as one method which meets such a requirement for pattern miniaturization. An electron beam drawing apparatus converges an electron beam emitted by an electron gun on a desired position on a substrate via an electron optical system, and relatively moves the electron beam and a stage which mounts the substrate, thereby drawing a pattern on the substrate. Hence, to form a fine pattern, it is of prime importance to accurately align the relative position between the electron beam and the substrate with as much as possible.

One factor which degrades the alignment accuracy between the electron beam and the substrate is a drift of the electron beam resulting from charge-up or heat. In electron beam drawing, charge-up of the electron optical system occurs due to electron scattering, and that of the substrate occurs upon electron beam irradiation. Also, deformation of the electron optical system and substrate occurs due to the influence of heat produced upon electron beam irradiation in drawing. When this occurs, a drift of the electron beam is generated upon a shift in irradiation position of the electron beam guided from the electron optical system onto the substrate or a change in electron beam trajectory due to factors associated with a charge distribution on the substrate. This poses a problem that the alignment accuracy in electron beam drawing degrades, thus deteriorating the pattern processing accuracy.

To solve the problem resulting from a drift of the electron beam due to charge-up, the following techniques have been proposed. Japanese Patent Laid-Open No. 2001-168013 describes an electron beam drawing method of using an electron detector which detects secondary electrons from the substrate to measure the position of each alignment mark formed on the substrate, thereby correcting a drift of the electron beam. In the method described in Japanese Patent Laid-Open No. 2001-168013, the alignment mark is irradiated with the electron beam at a predetermined timing after the start of drawing, and secondary electrons from the substrate are detected by the electron detector, thereby measuring the position of the alignment mark. Then, in the method described in Japanese Patent Laid-Open No. 2001-168013, the amount of drift of the electron beam is calculated based on the difference from the previous measurement result, and the calculation result is superposed on the amount of deflection of the electron beam, thereby correcting a drift of the electron beam.

Japanese Patent Laid-Open No. 2000-049069 describes an electron beam drawing apparatus which corrects a drift of the electron beam based on the position measurement result of each alignment mark obtained using the electron beam, and that obtained using light. The electron beam drawing apparatus described in Japanese Patent Laid-Open No. 2000-049069 includes an electron detector which detects secondary electrons from the substrate upon scanning the alignment mark using the electron beam, and an alignment optical system which irradiates the alignment mark with light and receives the light reflected by it. The electron beam drawing apparatus then calculates the amount of drift of the electron beam based on the position of the alignment mark measured using the light only once before the start of drawing, and that measured using the electron beam after the start of drawing. The electron beam drawing apparatus then corrects the position, to which the electron beam is deflected or the stage position, based on the calculated amount of drift, thereby correcting the drawing position of the electron beam.

Japanese Patent Laid-Open No. 63-263720 describes an electron beam drawing apparatus which corrects a positional shift between the electron beam and the substrate based on the position measurement result of each mark obtained using a mark measurement electron beam. The electron beam drawing apparatus described in Japanese Patent Laid-Open No. 63-263720 includes a mark measurement electron optical system, separately from a drawing electron optical system. The electron beam drawing apparatus sets the acceleration voltage of a mark measurement electron beam, emitted by a mark measurement electron gun, to a condition optimum for mark detection in accordance with the material and shape of the mark, and performs pattern drawing and mark measurement in parallel. The electron beam drawing apparatus then aligns the electron beam and the substrate based on the measurement result to correct the drawing position of the electron beam.

However, when the drawing operation is interrupted, and mark position measurement is performed upon driving the stage to move the alignment mark to the measurement position, the stage driving time and the mark position measurement time are necessary, separately from the drawing time, thus lowering the throughput. Therefore, it is difficult to achieve a high throughput using an electron beam drawing apparatus which performs mark position measurement upon interrupting the drawing operation after the start of drawing, as in Japanese Patent Laid-Open Nos. 2001-168013 and 2000-049069.

On the other hand, since the electron beam drawing apparatus as described in Japanese Patent Laid-Open No. 63-263720 can perform drawing and mark measurement in parallel, it can avoid degradation in throughput upon interrupting the drawing operation. However, both electron guns and electron optical systems are separately provided for drawing and mark measurement, so the amount of drift of the electron beam is not always equal in the two electron optical systems. Therefore, even when a shift in drawing position of the electron beam is corrected based on the measurement result using the mark measurement electron optical system, it is impossible to accurately correct a drift in the drawing electron optical system. Furthermore, providing two sets of an electron gun and an electron optical system for drawing and mark measurement leads to an increase in size, complication, and a rise in cost of the drawing apparatus.

SUMMARY OF THE INVENTION

In view of this, the present invention provides, for example, a drawing apparatus advantageous in terms of drawing precision and throughput thereof.

The present invention in its first aspect provides a drawing apparatus which performs drawing on a substrate with a plurality of charged particle beams, the apparatus comprising: a stage configured to hold the substrate and to be moved; a projection system configured to project the plurality of charged particle beams onto the substrate; a measurement device configured to detect a charged particle beam that reaches the measurement device due to a charged particle beam incident, via the projection system, on a mark formed on the substrate, to measure a position of the mark; and a controller, wherein the controller is configured to control operations of the projection system and the measurement device so that the position of the mark is measured with at least one of the plurality of charged particle beams, in parallel with drawing on the substrate with a part of the plurality of charged particle beams.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings. Note that the same reference numerals denote the same members throughout the drawings, and a repetitive description thereof will not be given. Although the present invention is applicable to a charged particle beam drawing apparatus which performs drawing for each shot region on a substrate with a plurality of charged particle beams, the present invention will be described by taking, as an example, a case in which the present invention is applied to an electron beam drawing apparatus which performs drawing using a plurality of electron beams.

First Embodiment

Figure 1:
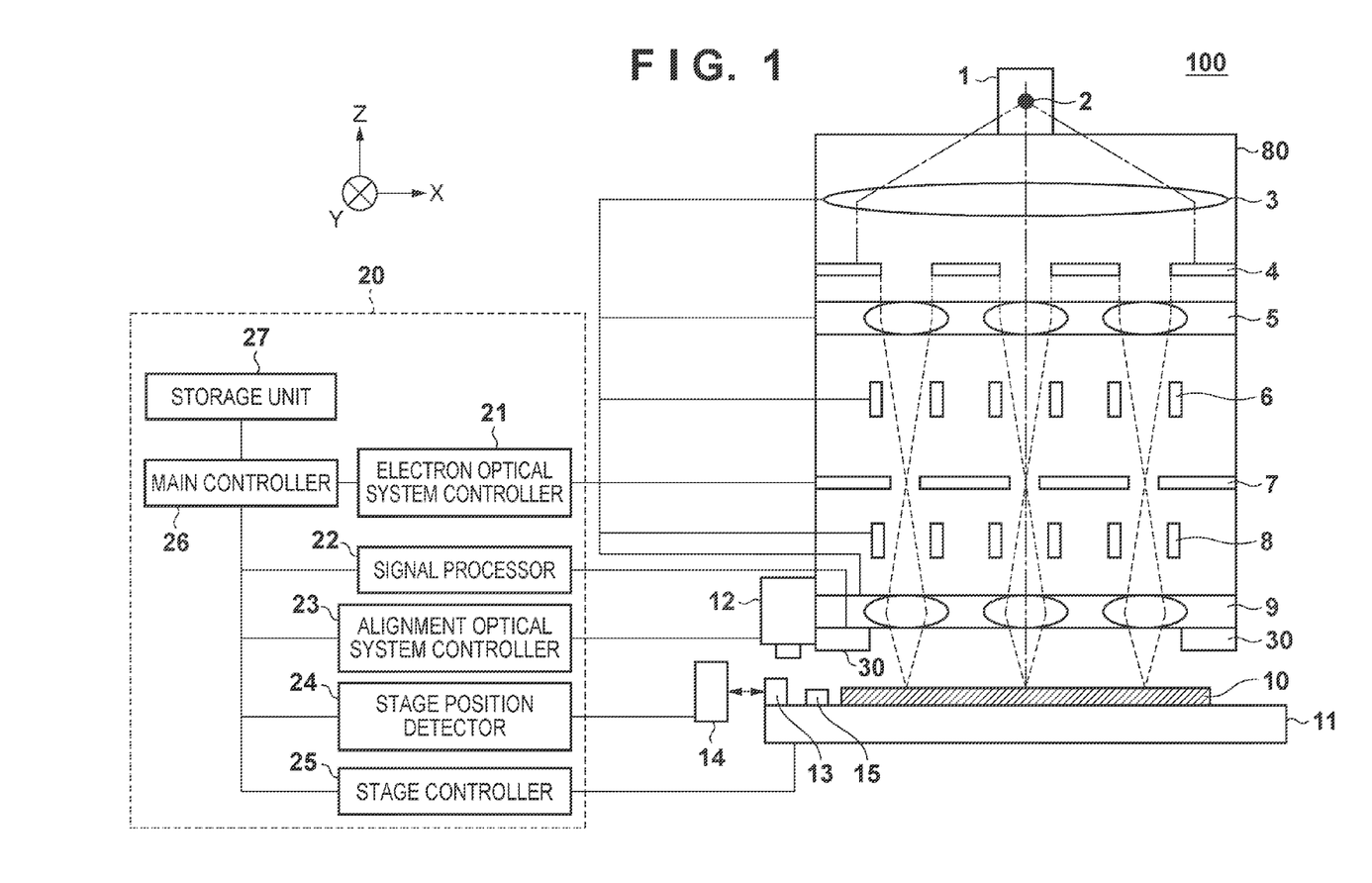
FIG. 1 is a block diagram showing the configuration of an electron beam drawing apparatus.

FIG. 1 is a block diagram showing the configuration of an electron beam drawing apparatus 100 according to the present invention. Note that the electron beam drawing apparatus may be substituted with an ion beam drawing apparatus which uses an ion beam, so the electron beam drawing apparatus according to this embodiment will be described as an example of a more general charged particle beam drawing apparatus. The same applies to other embodiments. The electron beam drawing apparatus 100 includes an electron gun 1, collimator lens 3, aperture array 4, electrostatic lenses 5 and 9, blanking deflector 6, blanking aperture 7, deflector 8, and stage 11. The electron gun 1 emits a plurality of electron beams. The collimator lens 3, aperture array 4, electrostatic lenses 5 and 9, blanking deflector 6, blanking aperture 7, and deflector 8 constitute an electron optical system 80 which forms images of a plurality of electron beams on the surface of a substrate 10. The electron optical system 80 is also called a charged particle beam optical system or a projection system. To align the electron beams and the substrate 10, an alignment optical system 12, a length measurement interferometer 14, and an electron detector 30 are arranged. The electron detector 30 constitutes a measurement device which detects a charged particle beam (secondary electrons) that reaches the electron detector 30 due to an electron beam incident, via the electron optical system 80 from the electron gun 1, on each mark formed on the substrate 10, thereby measuring the position of the mark.

The electron gun 1 forms a crossover image 2, and an electron beam diverging from the crossover image 2 is converted into a collimated light beam by the action of the collimator lens 3, and is incident on the aperture array 4. The aperture array 4 has a plurality of circular apertures arrayed in a matrix, and divides the incident electron beam into a plurality of electron beams. The electron beams having passed through the aperture array 4 are incident on the electrostatic lens 5 formed by three electrode plates (these three electrode plates are integrated with each other in FIG. 1) having circular apertures. The blanking aperture 7 formed by arranging small apertures in a matrix is disposed at the position at which the electron beams having passed through the electrostatic lens 5 form crossover images for the first time, and the blanking deflector 6 and blanking aperture 7 execute their blanking operation.

The electron beams having passed through the blanking aperture 7 form images by the second electrostatic lens 9, and the original crossover images 2 are formed on the substrate 10 such as a wafer or a mask. In drawing a pattern on the substrate 10 by the electron beams, an electron optical system controller 21 controls the deflector 8 to scan the electron beams, and controls the blanking deflector 6 in accordance with the pattern to be drawn to ON/OFF-control electron beam irradiation. Also, in measuring the position of the substrate 10 by the electron beams, the electron optical system controller 21 controls the deflector 8 to scan the electron beam with respect to each mark (alignment mark), formed on the substrate 10, and the electron detector 30 detects secondary electrons from the substrate 10, thereby obtaining the position of the alignment mark. Note that the electron optical system controller 21 controls the collimator lens 3 and electrostatic lenses 5 and 9 using a control circuit (not shown), and a signal processor 22 outputs data indicating the amounts of secondary electrons and reflected electrons detected by the electron detector 30, and supplies these data to a main controller 26. The main controller 26 calculates a mark signal (discrete signal sequence) serving as a signal indicating the amount of detected electrons corresponding to the amount of deflection, and stores this signal in a storage unit 27.

The electron detector 30 is disposed near the substrate 10, and detects secondary electrons from the substrate 10 to measure the position of each alignment mark. Referring to FIG. 1, the electron detector 30 is mounted on the electrostatic lens 9 at a position above the substrate 10. This makes it possible to accurately detect secondary electrons from the substrate 10, thus obtaining the position of each alignment mark with high precision. As another configuration, the electron detector 30 can include a Faraday cup disposed on the periphery of the electron optical system 80 in the vicinity of the substrate 10. Thus, the electron detector 30 can detect the charge amount of secondary electrons from the substrate 10 using the Faraday cut to measure the position of each alignment mark.

Each stage 11 shown in FIG. 1 has a configuration (not shown) in which an X stage is mounted on a Y stage, and can move while holding, on the X stage, the substrate 10 coated with a photosensitive material. Also, a reference plate 15 and an X-axis moving mirror 13 are provided on the X stage. The reference plate 15 has a reference mark formed on it at a position different from that of the substrate 10. The X-axis moving mirror 13 is set at one end on the X stage in the X direction. The Y stage positions the substrate 10 in the Y direction perpendicular to the paper surface of FIG. 1 within a plane perpendicular to the optical axes of the electron beams, and the X stage positions the substrate 10 in the X direction perpendicular to the Y-axis within the plane perpendicular to the optical axes of the electron beams. Note that a Z stage (not shown) which positions the substrate 10 in the Z direction parallel to the optical axes of the electron beams, for example, is mounted on the X stage as well. The positions of the Y stage and X stage are controlled by a stage controller 25. The length measurement interferometer 14 splits a laser beam emitted by a laser light source provided inside it into measurement light and reference light. The measurement light is guided to be incident on the X-axis moving mirror 13 provided on the stage 11, and the reference light is guided to be incident on a reference mirror provided inside the interferometer 14, so that the reflected measurement light and reference light are superposed on and interfere with each other. The intensity of the interfering light is then detected using a detector. Because the measurement light and the reference light have frequencies that differ by a very small amount $\Delta f$ at the time of emission, a beat signal obtained upon a change in frequency from $\Delta f$ in accordance with the movement speed of the X-axis moving mirror 13 in the X direction is output from the detector. This beat signal is processed by a stage position detector 24 so that the amount of change in optical path length of the measurement light with reference to the optical path length of the reference light, that is, the X-coordinate of the X-axis moving mirror 13 with reference to that of the reference mirror, is measured at a high resolution and high precision. Similarly, a length measurement interferometer (not shown) which detects the position of the stage 11 in the Y direction measures the Y-coordinate of a moving mirror, provided on the stage 11, with reference to that of a reference mirror at a high resolution and high precision.

The alignment optical system 12 guides non-exposure light to each alignment mark formed on the substrate 10 or stage 11, and forms an image of the light reflected by the alignment mark, thereby detecting an image of the alignment mark. The position of each alignment mark relative to the optical axis of the alignment optical system 12 is then obtained by an alignment optical system controller 23. The main controller 26, for example, processes data from the electron optical system controller 21, signal processor 22, alignment optical system controller 23, stage position detector 24, and stage controller 25, and issues instructions to the respective controllers. The storage unit 27 stores information necessary for the main controller 26. The electron optical system controller 21, signal processor 22, alignment optical system controller 23, stage position detector 24, stage controller 25, main controller 26, and storage unit 27 constitute a controller 20.

A drawing method for the electron beam drawing apparatus 100 will be described next. The electron beam drawing apparatus 100 draws a pattern in a plurality of shot regions (pattern drawing regions) on the substrate 10 by a step-and-scan operation. The drawing operation of the electron beam drawing apparatus 100 means an operation of repeatedly performing scan drawing and step movement to draw a pattern in the plurality of shot regions on the substrate 10 using electron beams. The electron beam drawing apparatus 100 deflects the electron beams to draw a pattern on the substrate 10 held on the stage 11. At this time, with movement of the stage 11, the electron beam drawing apparatus 100 controls the deflector 8 and the position of the stage 11 to control the electron beam irradiation positions relative to the substrate 10.

FIGS. 2A to 2D are views showing the arrangement of a plurality of electron beams 51 in an electron beam irradiation region 50 of the electron beam drawing apparatus 100, and a change in relative position between the electron beam irradiation region 50 and a shot region 40 in the drawing operation. In the electron beam irradiation region 50 shown in FIG. 2A, the plurality of electron beams 51 are arranged in a staggered pattern formed upon shifting the grid lines of a perfect grid arrangement of M rows×N columns with respect to each other by a distance L2 in the X direction. In drawing a pattern, the deflector 8 repeatedly deflects the electron beams 51 on the substrate 10 for each pixel in the range of the distance L2 in the X direction while the stage 11 continuously performs scan movement in the Y direction. At this time, the speed of the stage 11 is determined from the resist sensitivity and the value of the electron beam current density, and the distance L2 is determined by the deflection stroke of the deflector 8. In this embodiment, the Y direction serves as a first direction in which the stage 11 performs scan movement, and the X direction serves as a second direction perpendicular to the first direction.

Figure 2A:
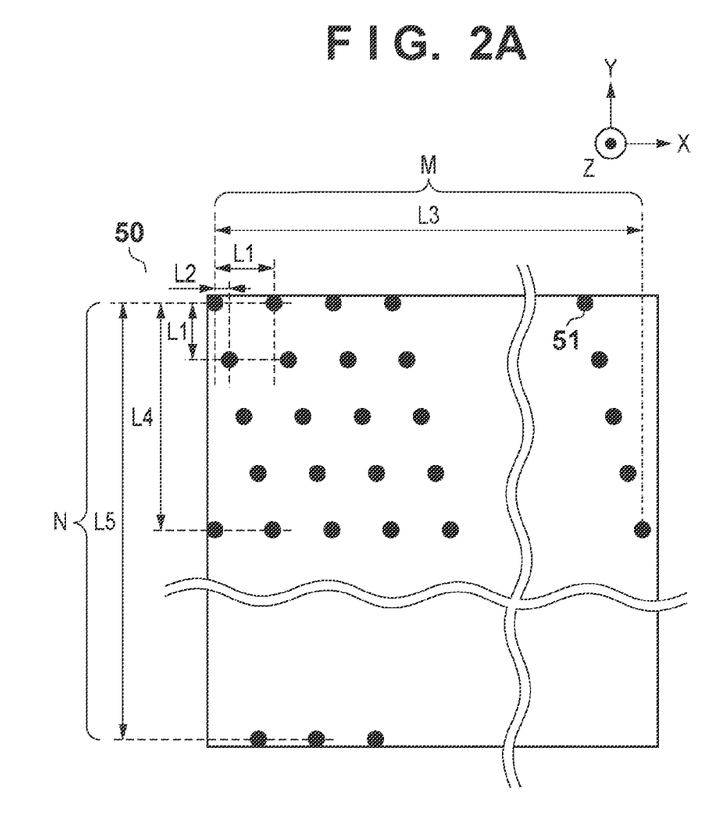
FIGS. 2A to 2D are views for explaining the drawing operation of an electron beam drawing apparatus according to the first embodiment.
Figure 2B:
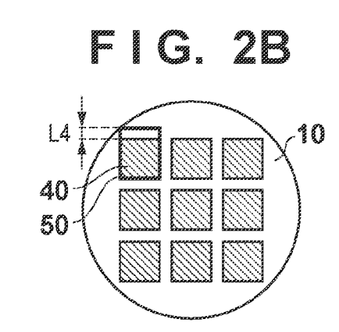
Figure 2C:
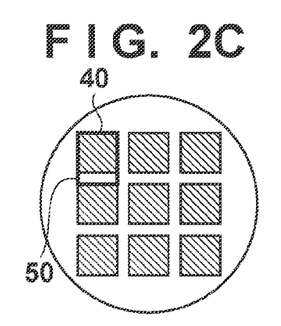
Figure 2D:
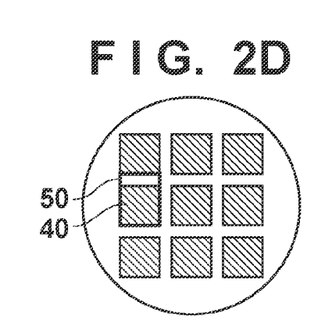

Drawing processing of the electron beam drawing apparatus 100 will be described next with reference to FIGS. 2B and 2D. Note that in the electron beam drawing apparatus 100 according to this embodiment, the electron beam irradiation region 50 is wider than the shot region 40, in which the drawing operation is performed, by a distance L4 in the Y direction, and is equal in distance in the X direction to the electron beam irradiation region 50. Also, the distances L3 and L5 of the electron beam irradiation region 50 in the X and Y directions, respectively, are sufficiently longer than the distances L1 and L4 in the X and Y directions, respectively. The main controller 26 draws a pattern while sequentially moving the electron beam irradiation region 50 relative to a plurality of shot regions 40 on the substrate 10 in the Y direction, as shown in FIGS. 2B to 2D. First, the main controller 26 aligns the electron beam irradiation region 50 with respect to the shot region 40, as shown in FIG. 2B, and then consequently performs scan drawing while performing scan movement of the substrate 10 by the distance L4 in the Y direction. Note that the shot region 40 and the electron beam irradiation region 50 have a positional relationship, as shown in FIG. 2C, after scan drawing. Next, the main controller 26 performs step movement of the stage 11 by a predetermined distance in the Y direction to move the electron beam irradiation region 50 to the next shot region 40, as shown in FIG. 2D. The main controller 26 repeatedly performs scan drawing with respect to these shot regions, and step movement between adjacent shot regions in the Y direction, thereby drawing a pattern in the plurality of shot regions 40 on the substrate 10. After that, the main controller 26 performs step movement of the substrate 10 by a predetermined distance in the X direction at each return position in the Y direction in the shot region 40 on the substrate 10 to perform scan drawing in the Y direction again. The main controller 26 repeatedly performs scan drawing for each shot region and step movement between adjacent shot regions, thereby performing drawing in all the shot regions 40 on the entire surface of the substrate 10. Although the electron beam irradiation region 50 is wider than the shot region 40 by the distance L4 in the Y direction in the electron beam drawing apparatus 100 according to this embodiment, the present invention is not limited to this. The size of the electron beam irradiation region 50 may be, for example, equal to or smaller than that of the shot region 40. In these cases, a desired pattern can be drawn in the shot regions 40 by adjusting the distance or direction of scan drawing.

Figure 3A:
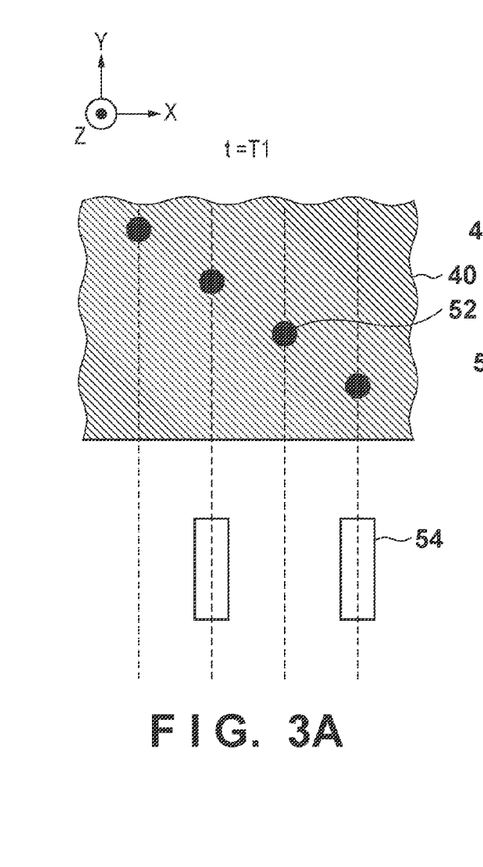
FIGS. 3A to 3C are views for explaining switching of the operation of a mark measurement electron beam in the first embodiment.
Figure 3B:
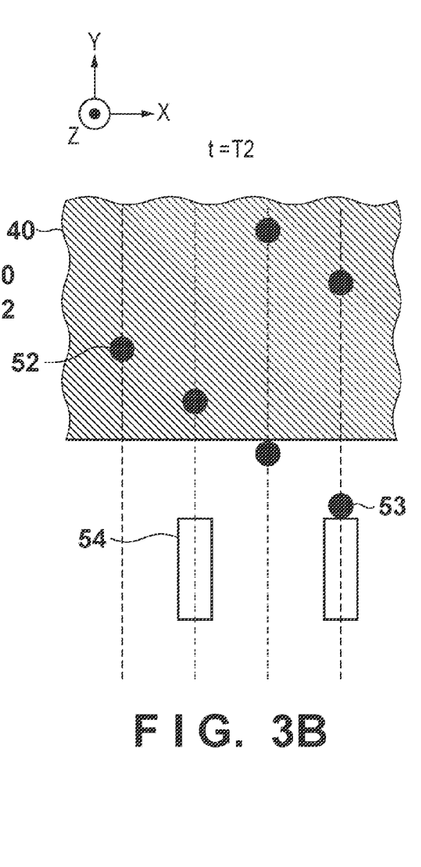
Figure 3C:
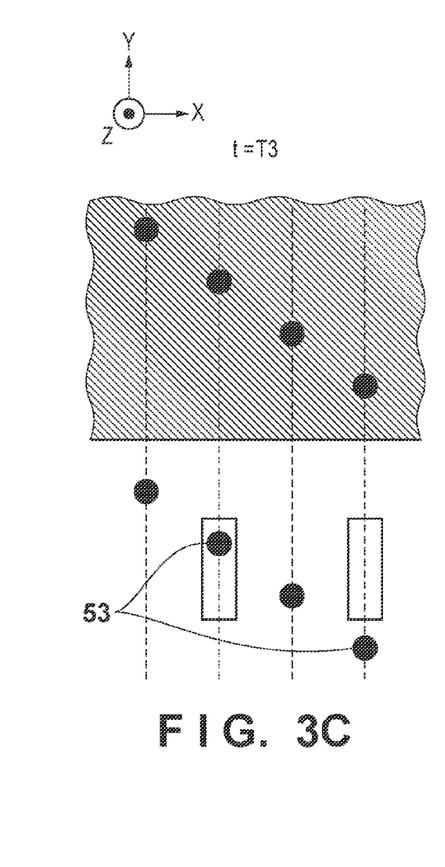

In this embodiment, during the period from the start of the drawing operation in one shot region 40 until its end, secondary electrons are detected by the electron detector 30 using at least one electron beam to measure the position of each alignment mark. Measurement of the position of each alignment mark during scan drawing in the drawing operation of the electron beam drawing apparatus 100 will be described in detail hereinafter. FIGS. 3A to 3C are views showing the positional relationship between the shot region 40 and a plurality of electron beams in the electron beam drawing apparatus 100, and show the state in which the relative position between the electron beams and the shot region 40 changes with movement of the stage 11 in the Y direction in the order of FIGS. 3A to 3C. Although the relative position between the electron beams and the shot region 40 is changed by moving the stage 11 while the electron beam irradiation positions are fixed in practice, the electron beam irradiation positions change in FIGS. 3A to 3C, for the sake of descriptive simplicity. Note that at time t described in FIGS. 3A to 3C, $T1<T2<T3$. Also, alignment marks 54 are formed in a scribe region that falls outside the shot region on the substrate 10. The scribe region in which the alignment marks 54 are formed is adjacent to the shot region 40 on an opposite side of the boundary line of the shot region 40 in the X direction (second direction). The alignment mark 54 is irradiated with an electron beam, and secondary electrons are detected using the electron detector 30, thereby measuring the position of the alignment mark 54. Note that the distance between the alignment mark 54 and the shot region 40 is shorter than the distance L4 in the electron beam irradiation region 50.

Referring to FIG. 3A, a plurality of electron beam irradiation positions are arranged in the shot region 40. Then, with movement of the stage 11 in the Y direction upon scan drawing, the relative position between the electron beams and the shot region 40 changes, as shown in FIG. 3C, through the state shown in FIG. 3B. Note that an electron beam used to draw a pattern in the shot region 40 is defined as a drawing electron beam 52, and that used to measure the position of the alignment mark 54 is defined as a mark measurement electron beam 53. In this embodiment, as shown in FIGS. 3A to 3C, during scan drawing, an electron beam having an irradiation position that falls outside the shot region 40 is scanned with respect to the alignment mark 54, thereby measuring the position of the alignment mark 54. That is, the operation of the mark measurement electron beam 53 is switched between pattern drawing and mark measurement at a predetermined timing during scan drawing to measure the position of the alignment mark 54. Note that the predetermined timing is the timing at which the irradiation position of the mark measurement electron beam 53 is located on the alignment mark 54, and is set in advance before the start of drawing based on data associated with the shot region 40 and the position of the alignment mark 54. Then, to measure the position of the alignment mark 54, the electron beam is scanned with respect to the alignment mark 54 by the blanking deflector 6, blanking aperture 7, and deflector 8. The alignment marks 54 are generally formed by a plurality of patterns, as shown in FIGS. 3A to 3C. Hence, to independently detect secondary electrons for each pattern, the timing at which the electron beam is scanned with respect to the alignment mark 54 may be shifted under the control of the blanking deflector 6, and secondary electrons may then be detected by the electron detector 30. Alternatively, a plurality of electron beams having different irradiation positions in the direction (Y direction) in which the stage 11 is scanned may be used. In this case, the plurality of electrons are scanned with respect to the alignment marks 54 at different timings, and secondary electrons are independently detected, thereby obtaining the positions of the alignment marks 54.

The drawing processing sequence of the electron beam drawing apparatus 100 according to this embodiment will be described next with reference to FIG. 4. The electron beam drawing apparatus 100 executes the following steps in accordance with a drawing processing flowchart, shown in FIG. 4, upon the start of drawing processing. In step S101, the main controller 26 moves the stage 11 so that the reference mark formed on the reference plate 15 is positioned on the optical axis of the alignment optical system 12, based on the design coordinate position of the reference mark. The main controller 26 then controls the alignment optical system controller 23 to detect a positional shift of the reference mark with respect to the optical axis, and re-sets a stage coordinate system (X-Y coordinate system), defined by the stage position detector 24, so that the origin of the stage coordinate system coincides with the optical axis, based on the detected positional shift. In step S102, the main controller 26 moves the stage 11 so that the reference mark is positioned on the optical axis of the electron beam, based on the design positional relationship between the optical axis of the electron beam and that of the alignment optical system 12. The main controller 26 then controls the electron optical system controller 21 to scan the electron beam with respect to the reference mark to detect a positional shift of the reference mark with respect to the optical axis of the electron beam, thereby determining the baseline between the optical axis of the electron beam and that of the alignment optical system 12.

In step S103, the main controller 26 selects a plurality of alignment marks 54 from the alignment marks 54 on the substrate 10, and moves the selected alignment marks 54 so that they are positioned on the optical axis of the alignment optical system 12, based on their design coordinate positions. The main controller 26 then controls the alignment optical system controller 23 to detect a positional shift of the alignment mark 54 with respect to the optical axis of the alignment optical system 12 to obtain the actual measurement value of the alignment mark 54 from the amount of positional shift and its design coordinate position. In step S104, the main controller 26 calculates a shift (movement) error, a magnification error, and a rotation error of the array of shot regions 40 on the substrate 10 by the global alignment method using the detection result obtained in step S103, thereby determining the regularity of this array. The main controller 26 then obtains a correction coefficient from the baseline and the determined array regularity to align the electron beams and the substrate 10 based on the obtained correction coefficient. The main controller 26 stores the correction coefficient obtained at this time in the storage unit 27.

In step S105, the main controller 26 selects and sets a mark measurement electron beam 53 for use in alignment mark measurement to perform correction (drift correction) of the incident position of the electron beam, from a plurality of electron beams on the substrate. Note that a method of setting a mark measurement electron beam 53 will be described in detail later. In step S106, the main controller 26 operates at least one of the deflector 8 and the stage 11 so that the position of the electron beam irradiation region 50 coincides with the drawing start position with respect to each shot region 40, and then starts scan drawing based on pattern data to be drawn in the shot region 40.

In step S107, the main controller 26 measures the position of the alignment mark 54 using the mark measurement electron beam 53, set in step S105, during scan drawing. The procedure of measuring the position of the alignment mark 54 during scan drawing will be described hereinafter. First, when the irradiation position of the mark measurement electron beam 53 reaches the position of the alignment mark 54 with movement of the stage 11, the main controller 26 controls the blanking deflector 6 to deflect the specific mark measurement electron beam 53 to be incident on the alignment mark 54. The main controller 26 then scans the mark measurement electron beam 53 with respect to the alignment mark 54 while deflecting the mark measurement electron beam 53 using the deflector 8 to detect secondary electrons from the substrate 10 using the electron detector 30. The position of the alignment mark 54 is obtained by, for example, differentiating a detection signal detected by the electron detector 30, and applying, for example, the edge detection method or the waveform symmetry evaluation method. The position measurement result of the alignment mark 54 obtained in step S107 is stored in the storage unit 27. Note that a method of measuring the position of the alignment mark 54 during scan drawing will be described in detail later.

In step S108, the main controller 26 calculates the amount of shift (amount of drift) of the incident position of the electron beam on the substrate from the difference between the position measurement result obtained in step S107, and that previously obtained using the alignment optical system 12 and mark measurement electron beam 53 in step S103. In step S109, the main controller 26 moves the stage 11 by the distance L4 in the Y direction after the start of scan drawing, and then stops scan drawing. If it is determined in step S110 that drawing is complete for all the shot regions 40 on the substrate 10, the main controller 26 ends the drawing processing on the substrate 10. On the other hand, if it is determined in step S110 that drawing is not complete for all the shot regions 40 on the substrate 10, the main controller 26 advances the process to step S111. In step S111, the main controller 26 controls the stage 11 to perform step movement of the relative position between the electron beams and the substrate 10 by a predetermined distance, thereby moving the electron beam irradiation region 50 to the next shot region 40.

In step S112, the main controller 26 determines whether drift correction is to be executed, based on the amount of drift calculated in step S108. If the amount of drift of the electron beam obtained in step S108 is smaller than a predetermined allowable value defined as a reference, the main controller 26 does not perform drift correction, and returns the process to step S106, in which it starts scan drawing again. On the other hand, if the amount of drift of the electron beam obtained in step S108 is larger than the allowable value, the main controller 26 advances the process to step S113. In step S113, the main controller 26 issues an instruction to the electron optical system controller 21 or stage controller 25 at a predetermined timing to adjust the electron beam deflection position or the position of the stage 11 based on the amount of drift calculated in step S108, thereby correcting a drift of the electron beam. The timing at which electron beam drift correction is executed will be described in detail later. After the main controller 26 ends electron beam drift correction in step S113, it returns the process to step S106, in which it restarts pattern scan drawing. The above-mentioned drawing processing is continued until drawing is completed for all the shot regions 40 on the substrate 10. If it is determined in step S110 that drawing is complete, all the processes end.

Although an electron beam drawing method which calculates the amount of drift of the electron beam in step S108 during scan drawing has been described with reference to FIG. 4, the present invention is not limited to this. In this embodiment, the amount of drift of the electron beam need only be calculated in step S108 before determination in step S112 as to whether drift correction is to be executed, so the amount of drift of the electron beam may be calculated, for example, during step movement in step S111. In this embodiment, the main controller 26 selects and sets a mark measurement electron beam 53 before the start of drawing, and switches the operation of the mark measurement electron beam 53 between pattern drawing and alignment mark measurement at a predetermined timing during scan drawing. The main controller 26 then measures the position of the alignment mark 54 using the mark measurement electron beam 53 during scan drawing to calculate and correct the amount of drift of the electron beam based on the measurement result.

A method of setting a mark measurement electron beam 53 will be described hereinafter. In this embodiment, in step S105 of FIG. 4, the main controller 26 selects and sets a mark measurement electron beam 53 from a plurality of electron beams in the electron beam drawing apparatus 100. At this time, if, for example, an electron beam positioned near the center of the electron beam irradiation region 50 is set as the mark measurement electron beam 53, a spacing of about a half of the distance L5 is generated between the alignment mark 54 and the mark measurement electron beam 53 before the start of scan drawing. Hence, even when scan drawing is executed to move the stage 11 by the distance L4 in the Y direction, the position of the alignment mark 54 is not irradiated with the mark measurement electron beam 53, thus making it impossible to measure the position of the alignment mark 54. Therefore, it is necessary to interrupt the drawing operation of the electron beam drawing apparatus 100 once, drive the stage 11 to move the position of the alignment mark 54 to the measurement position, and then measure the position of the alignment mark 54, thus leading to degradation in throughput.

On the other hand, if an electron beam positioned near either of the two ends of the electron beam irradiation region 50 in the Y direction is set as the mark measurement electron beam 53, the irradiation position of the mark measurement electron beam 53 changes from the interior of the shot region 40 to its exterior (or from its exterior to its interior) upon scan drawing. Hence, by executing scan drawing, the alignment mark 54 provided near the shot region 40 is irradiated with the mark measurement electron beam 53, thereby making it possible to measure the position of the alignment mark 54. Therefore, when an electron beam positioned near either of the two ends of the electron beam irradiation region 50 in the Y direction is set as the mark measurement electron beam 53, mark position measurement can be executed during scan drawing, thus making it possible to measure the position of the alignment mark 54 at high speed and high accuracy. As described above, in setting the mark measurement electron beam 53, an electron beam positioned near either of the two ends of the electron beam irradiation region 50 in the Y direction is selected. Note that as for the X direction, the main controller 26 selects and sets a mark measurement electron beam 53 based on the position coordinate of the alignment mark 54 on the substrate 10.

Measurement of the position of the alignment mark 54 by the mark measurement electron beam 53 during scan drawing of the electron beam drawing apparatus 100 will be described next. As described earlier, in scan drawing of the electron beam drawing apparatus 100, the electron beams are deflected in the X direction on the substrate 10 by the deflector 8 while continuously moving the stage 11 in the Y direction. Hence, in a configuration which controls the deflector 8 to deflect a plurality of electron beams at once at high speed, the mark measurement electron beam 53 is repeatedly deflected in the X direction, like the drawing electron beam 52. In the electron beam drawing apparatus 100 according to this embodiment, the main controller 26 deflects the mark measurement electron beams 53 in the X direction while moving the stage 11 in the Y direction with respect to the alignment marks 54 in the X and Y directions on the substrate 10. The main controller 26 then controls the electron detector 30 to detect secondary electrons from the substrate 10 to obtain the position of the alignment mark 54, thereby obtaining the relative position between the electron beam and the substrate 10 on the X-Y plane during scan drawing. Note that as for the alignment mark 54, an inverse V-shaped alignment mark 54 tilted by ±45° with respect to the X direction in the X-Y plane, for example, may be used to obtain the relative position (X,Y) between the electron beam and the substrate 10 by the mark measurement electron beam 53. Mark position measurement shown in step S107 of FIG. 4 is not limited to a case in which the positions of all the alignment marks 54 provided on the substrate 10 are measured, and may be executed for some selected alignment marks 54.

Figure 4:
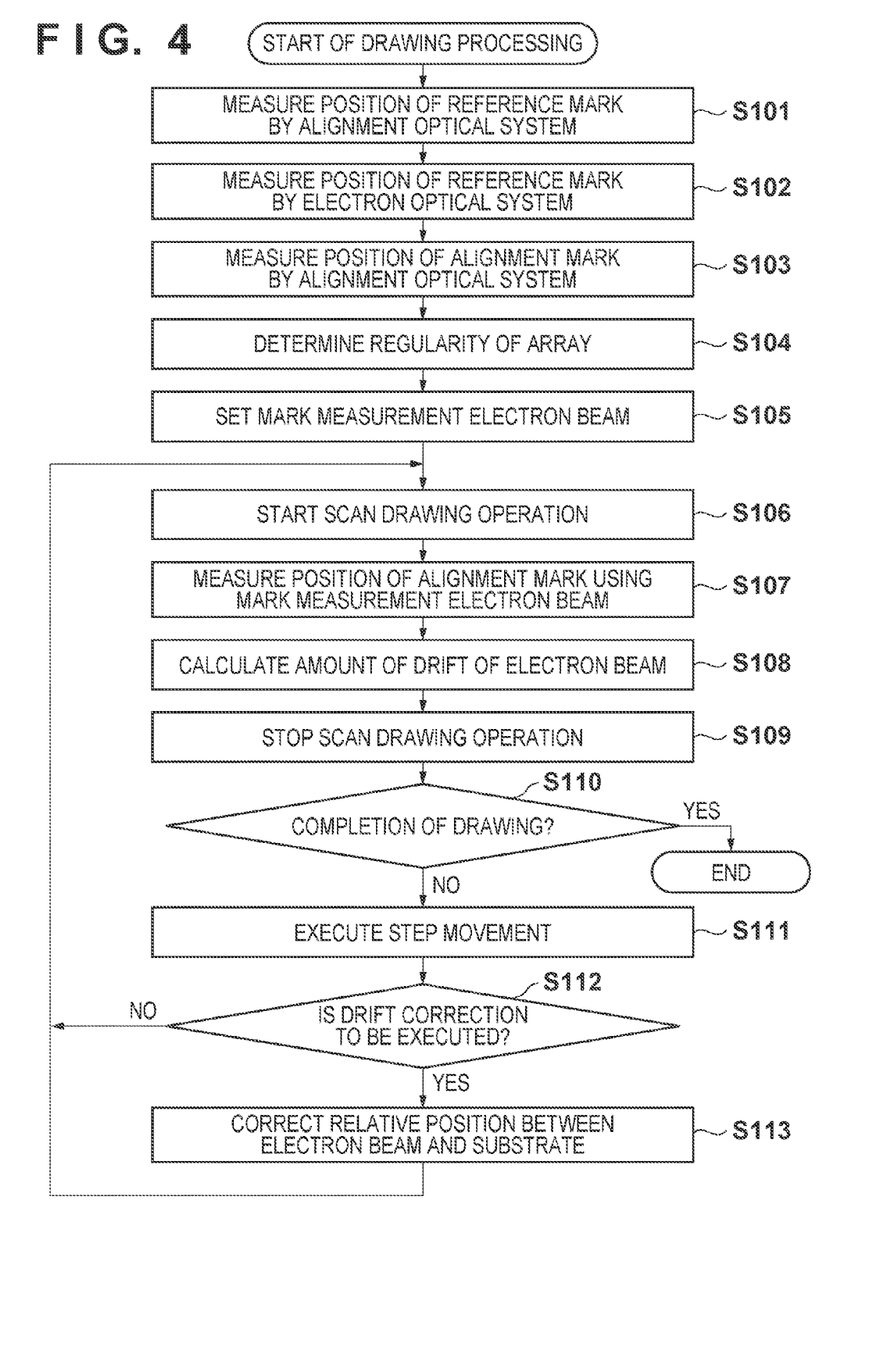
FIG. 4 is a flowchart of drawing processing in the first embodiment.

The timing at which electron beam drift correction shown in step S113 of FIG. 4 is executed will be described. The timing at which the main controller 26 executes drift correction of the electron beam drawing apparatus 100 can be every predetermined timing, but can also be the timing of the end of drawing for every chip or the timing of the end of drawing for every chip column. The electron beam drawing apparatus 100 according to this embodiment draws a pattern on the substrate 10 for each chip, as described with reference to FIGS. 2B to 2D. Hence, when correction is executed at every predetermined timing, a drift of the electron beam may be corrected in the course of drawing on one chip, thus generating a positional shift in the pattern to be drawn in the chip. On the other hand, when electron beam drift correction is executed at the timing of the end of drawing for every chip or the timing of the end of drawing for every chip column, a positional shift of the pattern to be drawn in the chip can be prevented. Hence, the timing at which electron beam drift correction is executed may be the timing of the end of drawing for every chip or the timing of the end of drawing for every chip column.

As described above, according to this embodiment, during scan drawing in the drawing operation of the electron beam drawing apparatus 100, the alignment mark 54 is irradiated with the mark measurement electron beam 53 set by the main controller 26 to measure the position of the alignment mark 54. The main controller 26 then calculates the amount of drift of the electron beam based on the measurement result of the alignment mark 54, and controls at least one of the stage 11 and the electron optical system 80 so that the incident position of the electron beam on the substrate 10 is corrected. Thus, in this embodiment, the time taken to move the position of the alignment mark 54 to the measurement position and that taken to measure the position of the alignment mark 54 can be shortened, thereby improving the throughput, compared to the conventional schemes described in Japanese Patent Laid-Open Nos. 2001-168013 and 2000-049069. Also, since the amount of drift is measured using an electron beam guided by the same electron optical system 80 as in the drawing electron beam 52, it is possible not only to attain drift correction with higher accuracy but also to more reliably avoid increases in cost and size of the electron beam drawing apparatus 100, than in the conventional method described in Japanese patent Laid-Open No. 63-263720. Therefore, according to this embodiment, it is possible to provide an electron beam drawing apparatus 100 capable of aligning the electron beams and the substrate 10 at high speed and high accuracy while requiring only a small space and low cost.

Second Embodiment

Figure 5A:
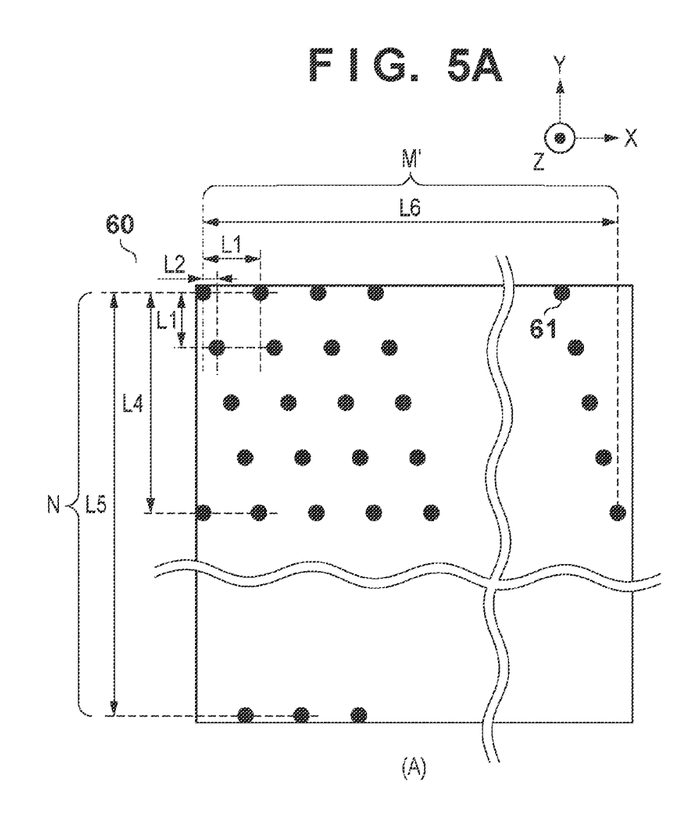
FIGS. 5A to 5F are views for explaining the drawing operation of an electron beam drawing apparatus according to the second embodiment.

An electron beam drawing apparatus 100 according to the second embodiment will be described with reference to FIGS. 5A to 5F. FIGS. 5B to 5F are views showing the arrangement of a plurality of electron beams 61 in an electron beam irradiation region 60 of the electron beam drawing apparatus 100, shown in FIG. 1, on a substrate 10, and a change in relative position between the electron beam irradiation region 60 and the substrate 10 upon the drawing operation. The length L6, in the X direction, of the electron beam irradiation region 60 irradiated with the plurality of electron beams 61 shown in FIG. 5A is smaller than the length of a shot region 40 in the X direction. Except for the length L6 in the X direction, the electron beam irradiation region 60 in the second embodiment has the same configuration as the electron beam irradiation region 50 in the first embodiment, so the plurality of electron beams 61 are arranged in a staggered pattern formed upon shifting the grid lines of a perfect grid arrangement with respect to each other by a distance L2 in the X direction.

The drawing operation of the electron beam drawing apparatus 100 according to this embodiment will be described next with reference to FIGS. 5B to 5F. In drawing a pattern on the substrate 10, the electron beams 61 are repeatedly deflected in the X direction on the substrate 10 for each pixel within the range of the distance L2 by a deflector 8 while a stage 11 continuously moves in the Y direction. In the electron beam drawing apparatus 100 according to this embodiment, the distance of the shot region 40 in the X direction is set to an integer multiple of the distance L6 of the electron beam irradiation region 60 in the X direction. The distance of the electron beam irradiation region 60 in the Y direction is larger than that of the shot region 40 by a distance L4, as in the electron beam irradiation region 50 according to the first embodiment. Note that the distances L6 and L5 of the electron beam irradiation region 60 in the X and Y directions, respectively, are sufficiently longer than the distances L1 and L4 in the X and Y directions, respectively.

Figure 5B:
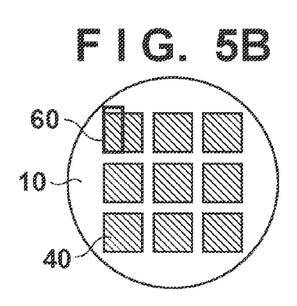
Figure 5C:
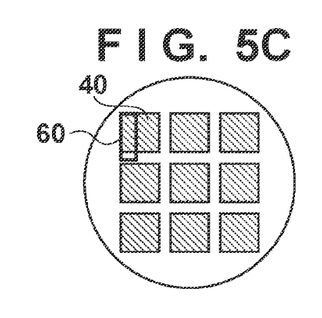
Figure 5D:
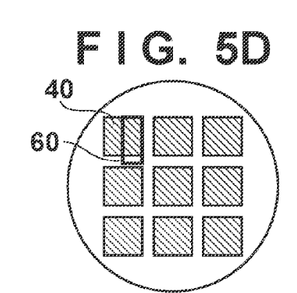

A main controller 26 sequentially moves the electron beam irradiation region 60 relative to the plurality of shot regions 40 on the substrate 10 to draw a pattern, as shown in FIGS. 5B to 5F. First, the main controller 26 aligns the electron beam irradiation region 60 with respect to the shot region 40, as shown in FIG. 5B, and then continuously performs scan drawing while performing scan movement of the substrate 10 by the distance L4 in the Y direction. The shot region 40 and electron beam irradiation region 60 after scan drawing have a positional relationship as shown in FIG. 5C. The main controller 26 then performs step movement of the stage 11 by the distance L6 in the X direction, as shown in FIG. 5D. After step movement, the main controller 26 performs scan drawing, in which a pattern is continuously drawn while moving the substrate 10 by the distance L4 in the −Y direction. The electron beam irradiation region 60 has a configuration in which an integer multiple of the distance L6 in the X direction is equal to the distance of the shot region 40 in the X direction, and the main controller 26 performs step movement of the stage 11 in the X direction, and then continuously performs scan drawing while moving the substrate 10 by the distance L4 in the −Y direction. The main controller 26 repeatedly performs this combination of scan drawing and step movement to draw a pattern in one entire shot region 40.

Figure 5E:
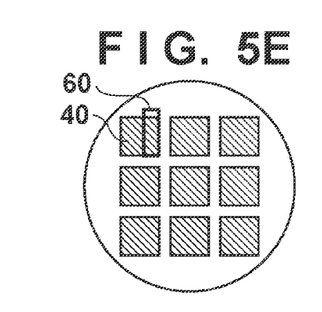
Figure 5F:
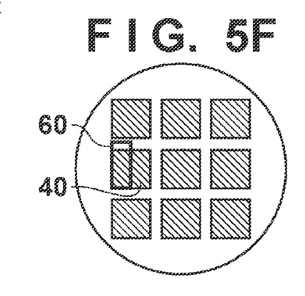

FIG. 5E shows the positional relationship between the shot region 40 and the electron beam irradiation region 60 after scan drawing in the −Y direction. Upon drawing processing in one shot region 40, the process advances from a state shown in FIG. 5B to that shown in FIG. 5E.

After pattern drawing in one shot region 40 is completed, the main controller 26 performs step movement of the stage 11 so that the electron beam irradiation region 60 is set at the drawing start position (a position shown in FIG. 5F) of the next shot region 40. Then, the main controller 26 performs a combination of scan drawing in the ±Y direction and step movement in the X direction again to draw a pattern in a plurality of shot regions 40 on the substrate 10. Note that the main controller 26 performs step movement of the stage 11 by a predetermined distance in the X direction at each return position in the Y direction in the shot region 40 on the substrate 10, and performs scan drawing in the Y direction again.

As described above, unlike the case of FIGS. 2B to 2D, the main controller 26 performs both an operation of performing step movement of the stage 11 in the X direction, and an operation of performing scan drawing while moving the stage 11 in the −Y direction, thereby drawing a pattern in one shot region 40 on the substrate 10. In this embodiment, during step movement in the shot region 40, a mark measurement electron beam 53 is guided to an alignment mark 54 and deflected, and secondary electrons are detected by an electron detector 30, thereby measuring the position of the alignment mark 54. A method of measuring the position of the alignment mark 54 will be described in detail later.

Figure 6:
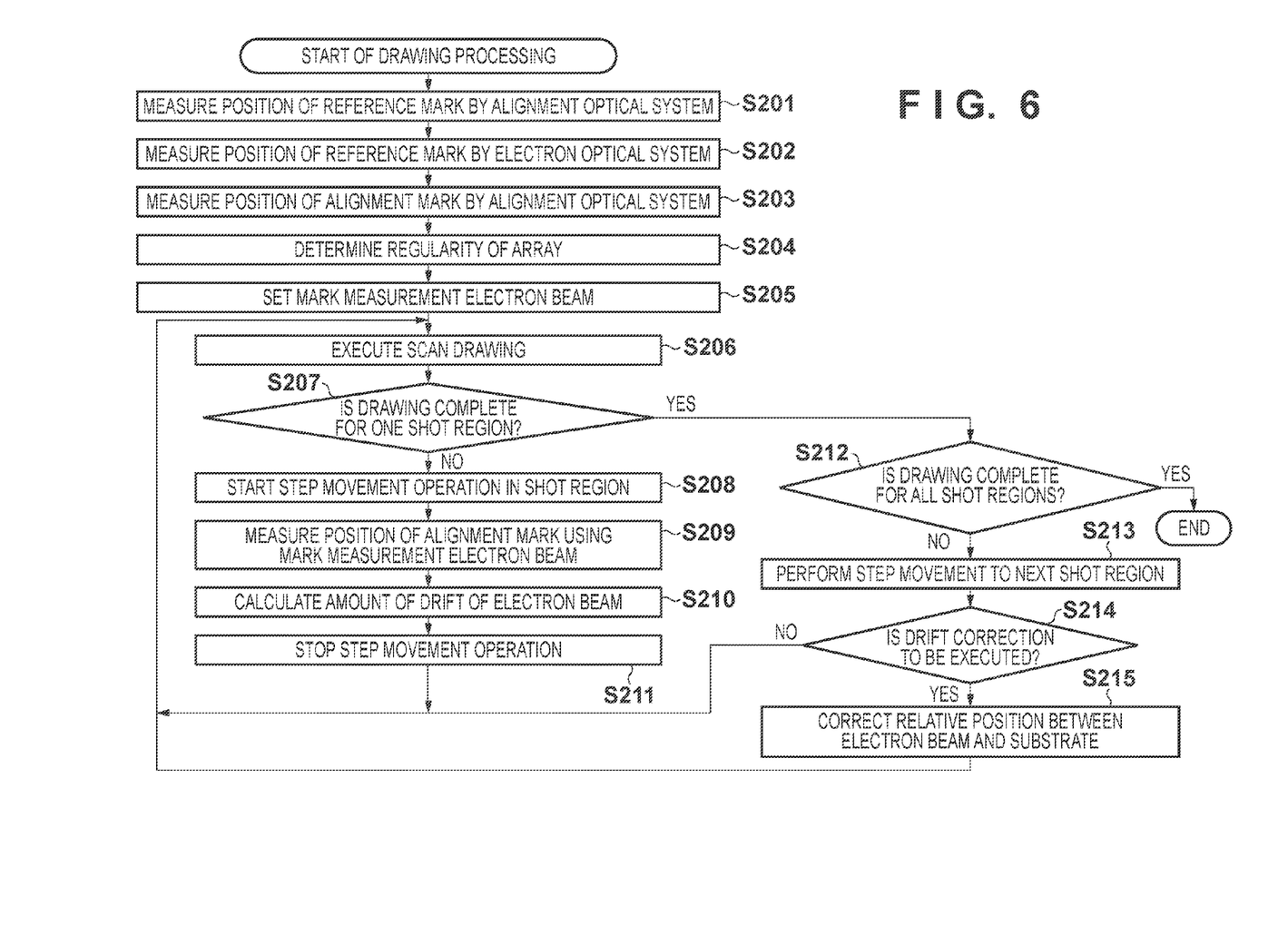
FIG. 6 is a flowchart of drawing processing in the second embodiment.

The drawing processing sequence of the electron beam drawing apparatus 100 according to this embodiment will be described next with reference to FIG. 6. In this embodiment, the main controller 26 executes the following steps in accordance with a drawing processing flowchart, shown in FIG. 6, upon the start of drawing processing. Note that details of steps S201 to S205 shown in FIG. 6 are the same as those of steps S101 to S105, respectively, shown in FIG. 4, and a description thereof will not be given. In step S206, the main controller 26 operates at least one of the deflector 8 and the stage 11 so that the position of the electron beam irradiation region 60 is matched with a predetermined position with respect to the shot region 40, and then performs scan drawing based on pattern data to be drawn in the shot region 40. The main controller 26 moves the stage 11 by the distance L4 in the Y direction after the start of scan drawing, and then stops scan drawing.

If it is determined in step S207 that drawing is complete for one shot region 40 on the substrate 10, the main controller 26 advances the process to step S212. On the other hand, if it is determined in step S207 that drawing is not complete for one shot region 40, the main controller 26 advances the process to step S208. In step S208, the main controller 26 starts an operation of controlling the stage 11 to perform step movement of the electron beam irradiation region 60 by the distance L6 in the X direction in the shot region 40. In step S209, the main controller 26 measures the position of the alignment mark 54 using the mark measurement electron beam 53, set in step S205, during step movement in the shot region 40 in step S207. Details of the procedure of measuring the position of the alignment mark 54 are the same as those in step S107 described in the first embodiment, and a description thereof will not be given herein.

In step S210, the main controller 26 calculates the amount of drift of the electron beam from the difference between the position measurement result of the alignment mark 54 obtained in step S208, and that previously obtained using an alignment optical system 12 and the mark measurement electron beam 53 in step S203. In step S211, the main controller 26 controls the stage 11 to perform step movement of the electron beam irradiation region 60 by the distance L6 in the X direction in the shot region 40, and then stops step movement. After stopping the step movement operation in the shot region 40, the main controller 26 returns the process to step S206, in which it performs scan drawing. If it is determined in step S212 that drawing is complete for all the shot regions 40 on the substrate 10, the main controller 26 ends the drawing processing on the substrate 10. On the other hand, if it is determined in step S212 that drawing is not complete for all the shot regions 40 on the substrate 10, the main controller 26 advances the process to step S213.

In step S213, the main controller 26 controls the stage 11 to perform step movement of the relative position between the electron beams and the substrate 10 by a predetermined distance to align the electron beam irradiation region 60 with a predetermined position in the next shot region 40 on the substrate 10. Note that in this embodiment, step movement by the stage 11 includes the following three types of step movement:

(1) step movement by the distance L6 in the X direction in one shot region, (2) step movement to the next shot region by a predetermined distance, and (3) step movement by a predetermined distance in the X direction at each return position in the Y direction.

During step movement by the distance L6 in the X direction in (1) among (1) to (3), the position of the alignment mark 54 is measured in this embodiment. The two types of step movement in (1) and (2) have been described with reference to FIGS. 6 and 5B to 5C. Also, step movement in (3) is executed at each return position in the Y direction in the shot region 40 on the substrate 10. These types of step movement in (1) to (3) are executed in accordance with the position of the shot region 40 on the substrate 10, and the state in which a pattern is drawn in the shot region 40.

Details of steps S214 and S215 are the same as those in steps S112 and S113, respectively, in FIG. 4, and a description thereof will not be given. Although an electron beam drawing method which calculates the amount of drift of the electron beam in step S209 during step movement in the shot region 40 has been described with reference to FIG. 6, the present invention is not limited to this. In this embodiment, the amount of drift of the electron beam need only be calculated in step S210 before determination in step S214 as to whether drift correction is to be executed, so the amount of drift of the electron beam may be calculated, for example, after stopping step movement in step S213. The order of execution of steps S214 and S215 is not limited, either, to the above-mentioned one, in which these steps are executed after the stop of step movement in step S213. For example, determination in step S214 as to whether drift correction is to be executed, and drift correction in step S215, may be executed during step movement in step S211, and scan drawing in step S206 may then be started after the stop of the operation of step movement.

In this embodiment, the main controller 26 selects and sets a mark measurement electron beam 53 before the start of drawing, and switches the operation of the mark measurement electron beam 53 between pattern drawing and alignment mark measurement at a predetermined timing during step movement in one shot region 40. The main controller 26 then measures the position of the alignment mark 54 using the mark measurement electron beam 53 during step movement to calculate and correct the amount of drift of the electron beam based on the measurement result.

Measurement of the position of the alignment mark 54 by the mark measurement electron beam 53 during step movement of the electron beam drawing apparatus 100 will be described hereinafter. In this embodiment, during step movement in which a blanking deflector 6 and a blanking aperture 7 execute their blanking operation, the main controller 26 scans the mark measurement electron beam 53 with respect to the alignment mark 54 to measure the position of the alignment mark 54. Measurement of the position of the alignment mark 54 in this embodiment can be executed during step movement by the distance L6 in the X direction in the shot region 40 in (1), among the three types of step movement in (1) to (3) by the stage 11, as described above.

In measuring the position of the alignment mark 54, the stage 11 may be driven in the Z direction to change the distance between the substrate 10 and an electrostatic lens 9, and secondary electrons from the substrate 10 may be detected by the electron detector 30, during step movement by the stage 11. At this time, if the stage 11 moves the substrate 10 and the electrostatic lens 9 closer to each other than during scan drawing, the distance between the electron detector 30 and the substrate 10 becomes smaller. This makes it possible to improve the detection sensitivity of the electron detector 30 to secondary electrons from the substrate 10. On the other hand, if the stage 11 moves the substrate 10 and the electrostatic lens 9 farther from each other than during scan drawing, the range on the X-Y plane, in which the electron detector 30 can detect secondary electrons, widens. Hence, the position of the alignment mark 54 can be measured by detecting secondary electrons from the substrate 10 by the electron detector 30 provided near the substrate 10 or on the periphery of the electron optical system 80. Note that an alignment mark 54 formed in a shape tilted by ±45° with respect to the X direction in the X-Y plane may be placed to obtain the relative position (X,Y) between the electron beam and the substrate 10 using the mark measurement electron beam 53, as described in the first embodiment. Alternatively, during step movement in the X direction, the electron beam may be deflected in the Y direction using the deflector 8 to measure the position of the alignment mark 54 having the Y direction as its longitudinal direction.

A method of setting a mark measurement electron beam 53 in the electron beam drawing apparatus 100 according to this embodiment will be described next. In this embodiment, as shown in step S205 of FIG. 6, the main controller 26 selects and sets a mark measurement electron beam 53 from a plurality of electron beams in the electron beam drawing apparatus 100. As described earlier, in this embodiment, the position of the alignment mark 54 is measured during step movement in the shot region 40 in the drawing operation. Hence, an electron beam having an irradiation position that passes on the alignment mark 54 upon step movement can be selected and set as the mark measurement electron beam 53 based on the driving data of the stage 11.

As described above, according to this embodiment, during step movement in the shot region 40 in the drawing operation, the main controller 26 irradiates the alignment mark 54 with the set mark measurement electron beam 53 to measure the position of the alignment mark 54. The main controller 26 then calculates the amount of drift of the electron beam based on the position measurement result of the alignment mark 54 to correct the relative position between the electron beam and the substrate 10. Thus, the electron beam drawing apparatus 100 according to this embodiment can shorten the time taken to move the position of the alignment mark 54 to the measurement position and that taken to measure the position of the alignment mark 54, thereby improving the throughput, compared to the conventional drift correction. Also, since the amount of drift is measured using an electron beam guided by the same electron optical system 80 as in the drawing electron beam 52, it is possible not only to attain drift correction with higher accuracy but also to more reliably avoid increases in cost and size of the electron beam drawing apparatus 100, than in the conventional method described in Japanese patent Laid-Open No. 63-263720.

Note that in this embodiment, during step movement in which the blanking deflector 6 and blanking aperture 7 execute their blanking operation, the position of the alignment mark 54 is measured using the mark measurement electron beam 53 to correct a drift of the electron beam. In the first embodiment, the position of the alignment mark 54 is measured during scan drawing, so secondary electrons from an electron beam other than the mark measurement electron beam 53 may simultaneously be detected and become noise. However, in this embodiment, the substrate 10 is irradiated with only the mark measurement electron beam 53, so noise produced by the electron detector 30 can be reduced. Thus, in this embodiment, a drift of the electron beam can be corrected more accurately than in the first embodiment. Therefore, according to this embodiment, it is possible to provide an electron beam drawing apparatus 100 capable of aligning the electron beams and the substrate 10 at high speed and high accuracy while requiring only a small space and low cost.

Although a method of measuring the position of the alignment mark 54 using the mark measurement electron beam 53 during step movement by the main controller 26 has been described above, the present invention is not limited to this. For example, the methods described in the first and second embodiments may be used in combination to measure the position of the alignment mark 54 during scan drawing in the Y direction and step movement in the X direction.

Third Embodiment

Figure 7:
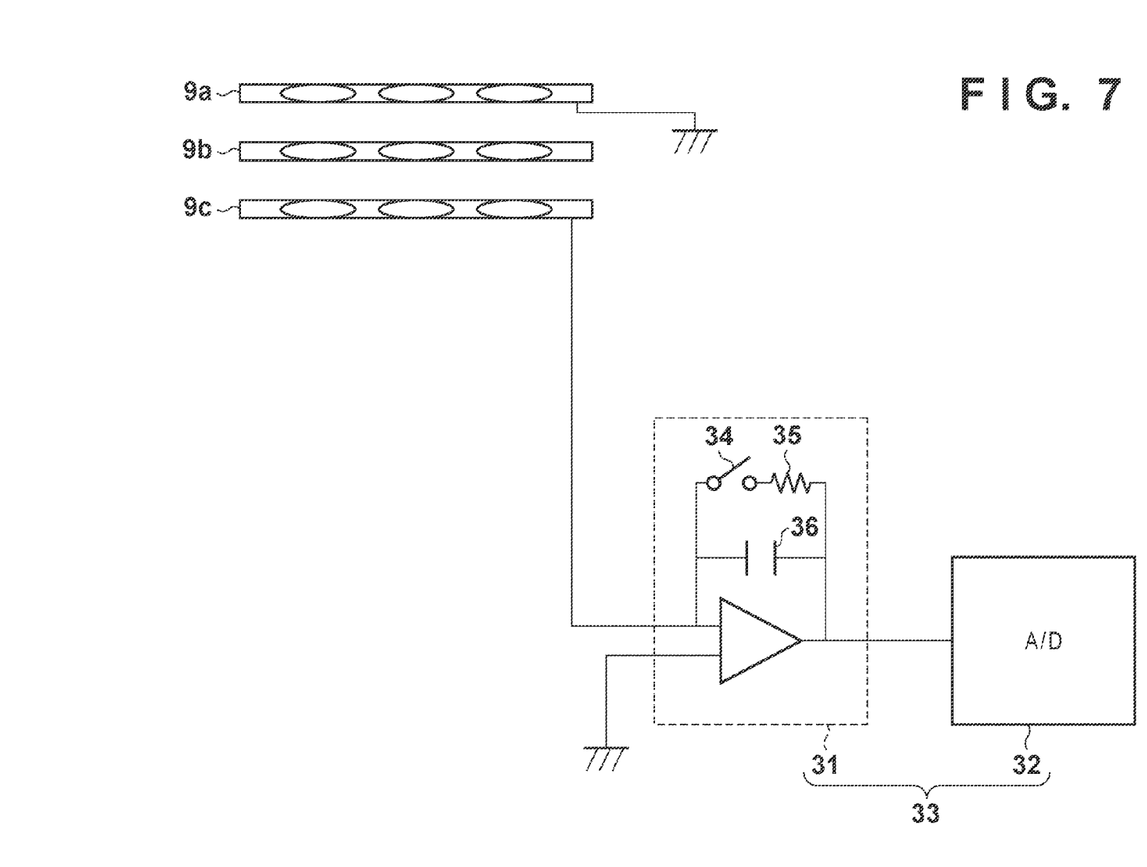
FIG. 7 is a circuit diagram showing the configuration of a measurement device in an electron beam drawing apparatus according to the third embodiment.

An electron beam drawing apparatus 100 according to the third embodiment will be described with reference to FIG. 7. A feature of this embodiment is the configuration of an electron detector 30, and a description thereof will specially be given. However, the remaining portions are the same as in the first embodiment, and a description thereof will not be given. FIG. 7 is a circuit diagram showing another configuration of the electron detector 30 in the electron beam drawing apparatus 100 shown in FIG. 1. A detecting circuit 33 is connected to the surface of an electrostatic lens (electron optical member) 9c, disposed closest to a substrate 10 among electrostatic lenses 9, so that the detecting circuit 33 uses this surface as a detecting surface to process secondary electrons detected by the detecting surface. The detecting circuit 33 includes an integrating circuit 31 and A/D converter 32. A secondary electron signal detected by the surface of the electrostatic lens 9c is integrated for a predetermined time by the integrating circuit 31, converted into a voltage signal, and then converted into a digital signal via the A/D converter 32, thereby making it possible to detect the amount of secondary electrons from the substrate 10. The detecting circuit 33 shown in FIG. 7 includes a switch 34 and resistor 35 to discharge the charge stored in a capacitor 36.

According to this embodiment, the position of an alignment mark 54 is measured based on secondary electrons detected by the surface of the electrostatic lens 9 during the drawing operation of the electron beam drawing apparatus 100. A main controller 26 then calculates the amount of drift of the electron beam based on the position measurement result of the alignment mark 54 to correct the relative position between the electron beam and the substrate 10. Thus, in this embodiment, the time taken to move the position of the alignment mark 54 to the measurement position and that taken to measure the position of the alignment mark 54 can be shortened, thereby improving the throughput, compared to the conventional drift correction. Also, since the amount of drift is measured using an electron beam guided by the same electron optical system 80 as in the drawing electron beam 52, it is possible not only to attain drift correction with higher accuracy but also to more reliably avoid increases in cost and size of the apparatus, than in the conventional method described in Japanese patent Laid-Open No. 63-263720.

In this embodiment, since secondary electrons from the substrate 10 are detected using the surface of the electrostatic lens 9 as a detecting surface, there is no need to provide an electron detector 30 on the electrostatic lens 9, unlike the electron beam drawing apparatus 100 shown in FIG. 1. There is no need, either, to dispose a Faraday cup on the periphery of the electron optical system 80 in the vicinity of the substrate 10. Hence, in this embodiment, the cost required for the electron detector 30 can be reduced, compared to the first and second embodiments. Also, the constraint in terms of the configuration of the electron beam drawing apparatus 100 is reduced to avoid, for example, providing the electron detector 30, thereby making it possible to shorten the distance between the electrostatic lens 9 and the substrate 10. Therefore, according to this embodiment, it is possible to provide an electron beam drawing apparatus 100 capable of aligning the electron beams and the substrate 10 at high speed and high accuracy while requiring only a small space and low cost.

[Method of Manufacturing Device]

A method of manufacturing a device according to an embodiment of the present invention is suitable for manufacturing devices such as a semiconductor device and an FPD. The method can include a step of drawing a pattern on a substrate 10, coated with a photosensitive agent, using the above-mentioned electron beam drawing apparatus 100, and a step of developing the substrate 10 having the pattern drawn on it. The method of manufacturing a device can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-291126 filed Dec. 27, 2010, which is hereby incorporated by reference herein in its entirety.

What is claimed is:

1. A drawing apparatus which performs drawing of a pattern in a shot region on a substrate with a plurality of charged particle beams, the apparatus comprising:
a projection system configured to project the plurality of charged particle beams onto the substrate;
a stage configured to hold the substrate and be movable with respect to the projection system;
a measurement device configured to detect a charged particle beam that reaches the measurement device due to a charged particle beam incident, via the projection system, on a mark formed outside the shot region, to perform measuring of a position of the mark; and
a controller configured to control the performance of the drawing and the performance of the measuring so that, while at least one charged particle beam among the plurality of charged particle beams is incident inside the shot region, the drawing is performed with the at least one charged particle beam, and, while the at least one charged particle beam is incident on the mark and at least another charged particle beam among the plurality of charged particle beams is incident inside the shot region, the measuring is performed with the at least one charged particle beam, in parallel with the drawing being performed with the at least another charged particle beam.

2. The apparatus according to claim 1, wherein:
the drawing includes scan drawing in which the drawing is performed with the at least one charged particle beam while scan movement of the stage is performed in a first direction,
the mark is formed in a scribe region extending in a second direction perpendicular to the first direction, and
the controller is configured to cause the measurement device to measure the position of the mark with the at least one charged particle beam that irradiates the scribe region, in parallel with the scan drawing being performed with the at least one charged particle beam.

3. The apparatus according to claim 2, wherein the controller is configured to cause the projection system to deflect the at least one charged particle beam that irradiates the scribe region, so that the at least another charged particle beam is incident on the mark.

4. The apparatus according to claim 1, wherein the measurement device includes a detecting circuit that has, as a detecting surface, a surface of a member, in the projection system, disposed closest to the stage.

5. The apparatus according to claim 1, wherein the measurement device includes a Faraday cup.

6. The apparatus according to claim 1, wherein the at least one charged particle beam is selected from the plurality of charged particle beams based on a position of the mark relative to the shot region.

7. The apparatus according to claim 1, wherein the mark is formed on the substrate, between the shot region and another shot region that is arranged next to the shot region on the substrate.

8. A drawing apparatus which performs drawing of a pattern in a shot region on a substrate with a plurality of charged particle beams, the apparatus comprising:
a projection system configured to project the plurality of charged particle beams onto the substrate;
a stage configured to hold the substrate and be movable with respect to the projection system;
a measurement device configured to detect a charged particle beam that reaches the measurement device due to a charged particle beam incident, via the projection system, on a mark formed outside the shot region, to perform measuring of a position of the mark; and
a controller configured to control the performance of the drawing and the performance of the measuring, the drawing including scan drawing in which the drawing is performed with the plurality of charged particle beams while a scan movement of the stage is performed in a first direction, and stepping in which a step movement of the stage is performed in a second direction perpendicular to the first direction so that, while at least one charged particle beam among the plurality of charged particle beams is incident inside the shot region, the drawing is performed with the at least one charged particle beam, while the at least one charged particle beam is incident outside the shot region and at least another charged particle beam among the plurality of charged particle beams is incident inside the shot region, the stepping being performed and the measuring being performed with the at least one charged particle beam, wherein a dimension of the shot region in the second direction is larger than a dimension, in the second direction, of a region irradiated with the plurality of charged particle beams.

9. The apparatus according to claim 8, wherein the controller is configured to control the performance of the drawing so that the drawing is not performed with the at least another charged particle beam while the stepping is being performed.

10. A method of manufacturing an article, the method comprising the steps of:

performing drawing on a substrate using a drawing apparatus;

developing the substrate on which the drawing has been performed; and processing the developed substrate to manufacture the article, wherein the drawing apparatus performs drawing of a pattern in a shot region on the substrate with a plurality of charged particle beams, the apparatus including:

a projection system configured to project the plurality of charged particle beams onto the substrate;

a stage configured to hold the substrate and be movable with respect to the projection system;

a measurement device configured to detect a charged particle beam that reaches the measurement device due to a charged particle beam incident, via the projection system, on a mark formed outside the shot region, to perform measuring of a position of the mark; and a controller configured to control the performance of the drawing and the performance of the measuring so that, while at least one charged particle beam among the plurality of charged particle beams is incident inside the shot region, the drawing is performed with the at least one charged particle beam, and, while the at least one charged particle beam is incident on the mark and at least another charged particle beam among the plurality of charged particle beams is incident inside the shot region, the measuring is performed with the at least one charged particle beam, in parallel with the drawing being performed with the at least another charged particle beam.

11. A method of manufacturing an article, the method comprising the steps of:

performing drawing on a substrate using a drawing apparatus;

developing the substrate on which the drawing has been performed; and processing the developed substrate to manufacture the article, wherein the drawing apparatus performs drawing of a pattern in a shot region on the substrate with a plurality of charged particle beams, the apparatus including:

a projection system configured to project the plurality of charged particle beams onto the substrate;

a stage configured to hold the substrate and be movable with respect to the projection system;

a measurement device configured to detect a charged particle beam that reaches the measurement device due to a charged particle beam incident, via the projection system, on a mark formed outside the shot region, to perform measuring of a position of the mark; and a controller configured to control the performance of the drawing and the performance of the measuring, the drawing including scan drawing in which the drawing is performed with the plurality of charged particle beams while a scan movement of the stage is performed in a first direction, and stepping in which a step movement of the stage is performed in a second direction perpendicular to the first direction so that, while at least one charged particle beam among the plurality of charged particle beams is incident inside the shot region, the drawing is performed with the at least one charged particle beam, while the at least one charged particle beam is incident outside the shot region and at least another charged particle beam among the plurality of charged particle beams is incident inside the shot region, the stepping being performed and the measuring being performed with the at least one charged particle beam, wherein a dimension of the shot region in the second direction is larger than a dimension, in the second direction, of a region irradiated with the plurality of charged particle beams.

* * * * *